US006768642B2

(12) United States Patent
Hines et al.

(10) Patent No.: US 6,768,642 B2
(45) Date of Patent: Jul. 27, 2004

(54) VME CIRCUIT HOST CARD WITH TRIPLE MEZZANINE CONFIGURATION

(75) Inventors: Douglas J. Hines, Endicott, NY (US); Eugene J. Urda, Binghamton, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 42 days.

(21) Appl. No.: 10/319,524

(22) Filed: Dec. 16, 2002

(65) Prior Publication Data

US 2004/0114331 A1 Jun. 17, 2004

(51) Int. Cl.[7] .................................................. H05H 7/20

(52) U.S. Cl. ...................... 361/721; 165/80.3; 165/185; 361/690; 361/706; 361/707; 361/711; 361/785; 361/790; 361/715; 439/61; 439/485

(58) Field of Search ............................... 165/80.2–80.3, 165/185; 174/16.3, 252; 361/688–722, 730–742, 784–790; 395/280, 500; 439/61, 74, 485–486

(56) References Cited

U.S. PATENT DOCUMENTS

| 4,716,498 | A | * | 12/1987 | Ellis | ........................... 361/715 |
| 4,730,232 | A | | 3/1988 | Lindberg | |
| 4,879,634 | A | | 11/1989 | Storrow et al. | |
| 4,916,575 | A | * | 4/1990 | Van Asten | .................. 361/715 |
| 5,010,444 | A | | 4/1991 | Storrow et al. | |

(List continued on next page.)

OTHER PUBLICATIONS

"Fine Pitch SMT Board to Board Connectors", Series 5015, ELCO, pp. 36–38.
"Conduction Cooled PCI Mezzanine Card (CCPMC)", VITA Standards Organization, Sep. 1999.

John Rynearson, "VSO Standards Update", VITA Technology Transitions, Dec. 2000, pp. 44–63.
"Draft Standard for a Common Mezzanine Card Family: CMC", IEEE P1386/Draft 2.0, Apr. 4, 1995.
Jeff Child, "New Choices Boost Up Mezzanine Modules' Utility", Electronic Designs, Feb. 8, 1999.
Jeff Child, "VME Maintains Its Ironclad Position as a High–End Bus Architecture", Electronic Designs, Sep. 14, 1998.
"Fine Pitch SMT Board to Board Connectors", Series 5015, ELCO. pp. 36–38.
"Conduction Cooled PCI Mezzanine Card (CCPMC)", VITA Standards Organization, Sep. 1999.
John Rynearson, "VSO Standards Update", VITA Technology Transitions, Dec. 2000, pp.44–63.
"Draft Standards for a Common Mezzanine Card Family: CMC", IEEE P1386/Draft 2.0, Apr. 4, 1995.
Jeff Child, "New Choices Boost Up Mezzanine Modules 'Utility", Electronic Designs, Feb. 8, 1999.
Jeff Child, "VME Maintains Its Ironclad Position as a High–End Bus Architecture", Electronic Designs, Sep. 14, 1998.

*Primary Examiner*—Gregory D. Thompson
(74) *Attorney, Agent, or Firm*—McGuireWoods LLP

(57) ABSTRACT

A circuit card assembly includes a host card having connector assemblies and a conduction-cooling path. A first and second mezzanine card each having electronic circuitry defining a component field is mounted to the conduction-cooling path of the host card and connected to the connector assemblies. A third mezzanine card is mounted to the host card and over at least a portion of the component field of the first and second mezzanine cards. A cooling path is provided between the third mezzanine card and the host card and mechanical interference is prevented between the third mezzanine card and the component field due to the profile of the conduction-cooling path. The conduction-cooling path may also be located on the third mezzanine card or on both the host card and the third mezzanine card. The third mezzanine card is connected to the connector assemblies outside of the connector area of the other mezzanine cards.

20 Claims, 3 Drawing Sheets

(2, 3 OR 4 CONNECTORS OPTIONAL)

U.S. PATENT DOCUMENTS

| | | | |
|---|---|---|---|
| 5,214,570 A | * | 5/1993 | Shah et al. .................. 361/684 |
| 5,396,401 A | | 3/1995 | Nemoz |
| 5,406,455 A | | 4/1995 | Devenish, III |
| 5,440,181 A | | 8/1995 | Gruender, Jr. et al. |
| 5,528,455 A | | 6/1996 | Miles |
| 5,628,637 A | | 5/1997 | Pecone et al. |
| 5,675,472 A | | 10/1997 | Hamerton-Kelly |
| 5,793,998 A | | 8/1998 | Copeland et al. |
| 5,892,658 A | | 4/1999 | Urda et al. |
| 5,903,439 A | | 5/1999 | Tamarkin |
| 5,980,275 A | | 11/1999 | Beaman et al. |
| 5,984,688 A | | 11/1999 | Norris |
| 5,999,407 A | * | 12/1999 | Meschter et al. ........... 361/704 |
| 6,026,565 A | | 2/2000 | Giannatto et al. |
| 6,064,575 A | | 5/2000 | Urda et al. |
| 6,104,613 A | | 8/2000 | Urda et al. |
| 6,128,187 A | | 10/2000 | Mimlitch, III et al. |
| 6,212,075 B1 | | 4/2001 | Habing et al. |
| 6,246,582 B1 | | 6/2001 | Habing et al. |
| 6,292,923 B1 | | 9/2001 | Genrich et al. |
| 6,392,891 B1 | | 5/2002 | Tzlil et al. |
| 6,538,884 B1 | * | 3/2003 | Wong et al. ................. 361/688 |
| 2002/0029457 A1 | | 3/2002 | Giese et al. |
| 2002/0081890 A1 | | 6/2002 | Obermaier |

* cited by examiner

VME CIRCUIT HOST CARD WITH TRIPLE MEZZANINE CONFIGURATION

BACKGROUND OF THE INVENTION

1. Field of the Invention

The present invention generally relates to a circuit host card with modules connected thereto and, more particularly, to a circuit host card having three electronic circuit board modules or mezzanine cards connected thereto.

2. Background Description

Printed circuit boards (PCB) or printed wiring boards (PWB) have been known for many years and may be formed by many techniques (e.g. screening, plating, etching, etc.). Printed wiring boards provide for a compact, structurally robust and easily manufactured electronic circuit structure. In use, discrete electronic components and integrated circuits are affixed to the boards via a host of commonly known techniques. Input/Output (I/O) pins are connected to the printed circuit boards (PCB) or printed wiring boards (PWB) in order to make connections to other components of an integrated system.

As electronic systems, such as communication systems and data processors, have become more complex, the use of multiple printed circuit boards connected to each other has been implemented. For ease of maintenance and repair, these complex systems have been fabricated in a modular form, often of standardized dimensions. These standardized dimensions, though, place limits on the size and shape of the module and hence the packaging density or packaging area of the system.

At the present time, a prevalent standard for modular circuit packaging is commonly known as the "Versa Module Europa" (VME) which incorporates a number of design standards including those known in the art as IEEE standard 1101.1, IEEE standard 1101.2, VITA20, ANSI/VITA1, VITA1.1 (VME64X) and IEEE standard P1386. While these standards allow some degree of freedom in component layout within the module, all of the standards involved in the collective VME standard are directed to modules including only a single printed wiring board having components mounted on only a single side thereof. Thus, in order to augment the area of the single VME standard board (also known as a host or main board), one or two circuit boards may be mounted to the host board via interconnections. These boards are known in the art as mezzanine boards or cards. Although the mezzanine boards increase the packaging density, the mezzanine board solution is limited to less than doubling the available area of the host board due to the configuration of the host board and placement of the connectors in accordance with the VME standard.

At present, there is only very limited ways known to further augment the printed wiring board area. This is due to several different reasons; namely, for example:

(i) The size of the host board;
(ii) The size of the mezzanine boards;
(iii) The placement and configuration of the I/O pins;
(iv) The placement and configuration of the connector assemblies between the host board and the mezzanine boards; or
(v) The cooling requirements of the entire system.

Being more specific, the host board is limited to certain dimensions, i.e., approximately 233.5 mm by 160 mm (equivalent to approximately 9"×6.25"), which limits the mounting area of the connectors and mezzanine boards. The mezzanine board is also limited in size to approximately 74 mm×145 mm (approximately 3"×5.5"). The I/O pins are placed at the edge of the board and are typically designated P1, P2, P0, where P0, P1 and P2 are multiple row multiple-pin configurations. This pin configuration also limits the placement of additional components and mezzanine boards. The mezzanine connector assemblies, on the other hand, may range from two to four connectors, but a first set of connectors must be placed within a range of approximately 40 mm+/−25.5 mnm from a side edge of the host board (leaving a space on the other opposite edge side of the board). This latter requirement provides a very exacting standard for the placement of the mezzanine boards thus, again, limiting the placement of additional components and mezzanine boards. Lastly, cooling ribs run along the length of the host board for dissipating heat generated from the mezzanine boards. This further limits the space and placement of the mezzanine boards. Thus, taking all of this into account, further augmenting the printed wiring board area has been difficult to achieve by card designers.

But, to overcome many shortcomings associated with the industry standard, the card design industry has devised several different solutions from adding additional host boards to removing certain functions from the host board or mezzanine boards. The former solution, though, requires additional costs, manufacturing and installation; whereas, the latter solution simply is not a very viable option. Another approach has been to add additional circuit cards to the backplane of the host board. This option adds complicated design considerations such as, for example, connection problems, the placement of the I/O pins and the like. All of these design considerations also add needlessly to the manufacturing and assembly costs.

The present invention is directed to overcoming one or more of the problems as set forth above.

SUMMARY OF THE INVENTION

In a first aspect of the invention, a circuit card assembly includes a host card having connector assemblies and a conduction-cooling path mounted thereon. At least one base mezzanine card having electronic circuitry defining a component field is provided. The at least one base mezzanine card is mounted to the conduction-cooling path of the host card and is further connected to the connector assemblies. A supplementary mezzanine card having electronic circuitry mounted thereon is mounted to the host card and over at least a portion of the component field. The mounting configuration provides a cooling path between the supplementary mezzanine card and the host card and also prevents mechanical interference between the supplementary mezzanine card and the component field. The supplementary mezzanine card is connected to another of the connector assemblies of the host card outside of the connector and PWB component field area of the at least one base mezzanine card.

In embodiments, the at least one base mezzanine card is a first base mezzanine card and a second base mezzanine card mounted in substantially a same mounting plane with respect to one another. The supplementary mezzanine card is a third mezzanine card mounted outside the connector and PWB component field area of the first and second base mezzanine cards. The third mezzanine card may be mounted over one of:

(i) a portion of the component field of the first base mezzanine card,
(ii) a portion of the component field of the first base mezzanine card and the component field of the second base mezzanine card, and (iii) the component field of the first base mezzanine card and the component field of the second base mezzanine card.

The circuit card assembly, in further embodiments, includes a center cooling rib running along a length of the host card and side edge cooling ribs running along opposing edges of the host card. The at least one base mezzanine card is mounted to the center cooling rib and the supplementary mezzanine card is mounted to the side edge cooling ribs. In still further embodiments, the supplementary mezzanine card includes a cooling rib corresponding to a location of and mounted to the side edge cooling ribs and a faceplate cooling rib of the host card. A profile of the side edge cooling ribs and the cooling rib prevents mechanical interference between the another mezzanine card and the component field and further provides the cooling path. In yet another embodiment, the supplementary mezzanine card includes opposing cooling ribs corresponding to side edges of the host card for mounting thereon, and has a profile that prevents mechanical interference and provides the cooling path between the another mezzanine card and the host card.

In another aspect of the present invention, the host card has connector assemblies and a conduction-cooling path mounted thereon. A first base mezzanine card has electronic circuitry defining a component field. The first base mezzanine card is mounted to the conduction-cooling path and is further connected to a first set of the host mezzanine connector assemblies. A second base mezzanine card has electronic circuitry defining a component field and is mounted to the conduction-cooling path and is connected to a second set of the connector assemblies. A third mezzanine card is mounted to the host card over at least a portion of the component field of the first and/or second base mezzanine cards such that mechanical interference between the third mezzanine card and the component field of the first and second base mezzanine cards is prevented. The third mezzanine card is further connected to a third set of the connector assemblies of the host card outside of the connecting area and component field of the first and second mezzanine cards. At least the conduction-cooling path provides a cooling path between the first and second mezzanine cards and the host card.

In embodiments, the conduction-cooling path of the host card also provides a cooling path between the third mezzanine card and the host card. Alternatively, a conduction-cooling path on either the third mezzanine card or both the third mezzanine card and the host card provides the cooling path.

In yet another embodiment, a circuit card assembly includes first, second and third mezzanine cards mounted and connected to a host card. The third mezzanine card is connected outside a connecting area of the first and second mezzanine cards. A cooling path of the host card is used to mount the first, second and third mezzanine cards. The third mezzanine card also includes a conduction-cooling path that is mounted to the conduction-cooling path of the host card. The combination of the conduction-cooling paths provide a cooling path between the third mezzanine card and the host card. In embodiments, the profile of the conduction-cooling paths also prevents mechanical interference between the third mezzanine card and the first and second mezzanine cards.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is directed to a circuit host card with two or more modules or circuit cards connected thereto and, more preferably, to a circuit host card having three mezzanine boards or cards connected thereto. The present invention introduces an increased functional square area to the host card for the packaging of electronic components. The use of the additional or third mezzanine card increases the functionality of the entire system while maintaining and utilizing known VME standards. In other words, the present invention eliminates the need to design and manufacture an additional and separately installed circuit card when component placement needs are greater than what the industry standard VME can provide for the designed system. The present invention is readily customizable and provides the necessary flexibility to assemble and disassemble the system in accordance with known standards. A cooling path is also provided to ensure that the additional or third mezzanine board is compatible with a conduction cooled VME host card. It should be recognized by those skilled in the art that the terms "board" and "card" may be used interchangeably herein within the scope and meaning of the present invention.

Embodiments of The Host Card Using a Triple Mezzanine Configuration

Figure 1:
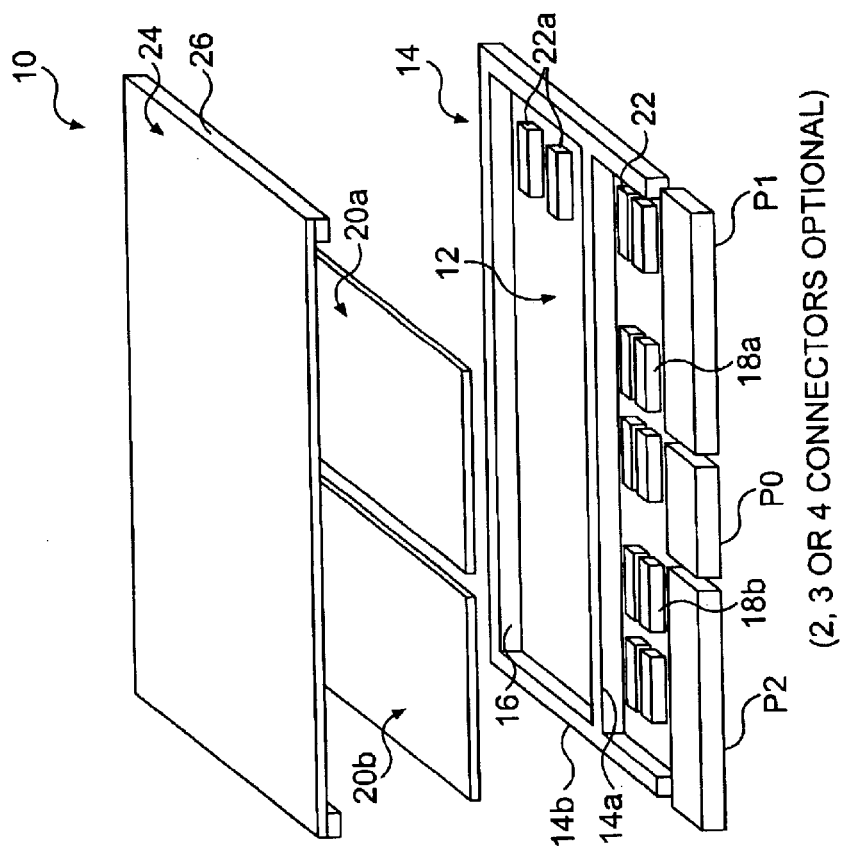
FIG. 1 shows an unassembled perspective view of the host card and mezzanine cards of the present invention.

FIG. 1 shows an unassembled perspective view of the host card and mezzanine card configuration of the present invention. The assembly is generally depicted as reference numeral 10 and includes a host card 12. The host card 12 includes cooling ribs, generally depicted as reference numeral 14. The cooling ribs act as conduction paths, as discussed below. In one embodiment, the cooling ribs include a center cooling rib 14a and outer edge cooling ribs 14b running along side edges of the host card 12. A faceplate rib 16, connecting between the outer edge cooling ribs 14b and parallel to the center cooling rib 14a, runs along a length of the host card 12. The faceplate rib 16 may also act as a conduction path. The cooling ribs and faceplate rib may be made of any type of known conduction material such as, for example, aluminum. Conventional Input/Output (I/O) pins, designated as P0, P1 and P2, are provided at an edge of the host card 12.

Still referring to FIG. 1, the host card 12 further includes a first and second set of PCI mezzanine card (PMC) connectors 18a, 18b positioned between the I/O pins and the center rib 14a. The PMC connectors 18a, 18b may be any conventional two, three or four connector assemblies for connecting a first base mezzanine card 20a and a second base mezzanine card 20b, respectively, to the host card 12 (in a substantially a same mounting plane). Accordingly, the present invention is not limited to the four-connector configuration shown in FIG. 1. Although not shown, the first and second mezzanine cards 20a, 20b may be a single mezzanine card. Also, each of the mezzanine cards includes respective connectors and electronic components mounted thereon.

A third set of PMC connectors 22 is provided on the host card 12, and is provided for connecting an supplementary or third mezzanine card 24 to the host card 12. It should be well recognized that the designation of "third" used herein is provided for convenience and may equally be a "second" card when the first and second mezzanine cards 20a and 20b are combined into a single, larger mezzanine card, or simply when either the first or second mezzanine card is eliminated The third set of PMC connectors 22 may be positioned at any area of the host card 12, outside of the mounting area for the first and second mezzanine cards 20a, 20b. In further embodiments, additional connectors 22a may be positioned between the center rib 14a and the faceplate rib 16. Thus, as with the connectors 18a, 18b, the connectors 22 (22a) may be two, three or four connector assemblies.

A cooling rib or cooling ribs 26 may be positioned about the perimeter of the third mezzanine card 24, preferably about three sides corresponding to the location of the outer edge ribs 14b and the faceplate rib 16. The cooling rib 26 may be used to provide stability and rigidity to the third mezzanine card 24, as well as provide a conduction-cooling path to the host card 12 from the third mezzanine card 24. Depending on the size and connection position of the third mezzanine card 24 (see, FIG. 2c), the profile of the cooling rib 26 with the outer edge ribs 14b and/or the face plate rib 16 will allow the third mezzanine card 24 to be mounted at a height above:

(i) a portion of either the component field of the first or second mezzanine cards, 20a, 20b;

(ii) a portion of the component field of the second mezzanine card 20b and the component field of first mezzanine card 20a;

(iii) a portion of the component field of the first mezzanine card 20a and the component field of the second mezzanine card 20b;

(iv) the component field of the first mezzanine card 20a and the second mezzanine card 20b; or (v) the component field or a portion of the component field of a single mezzanine card (which may be a combination of the first and second mezzanine cards or portions thereof).

This mounting configuration prevents mechanical interference or contact between the third mezzanine card 24 and the components mounted on the first and second mezzanine cards 20a, 20b. Additionally, the cooling rib 26 used with the outer edge ribs 14b and/or the face plate rib 16 provides a conduction-cooling path for the third mezzanine card 24. As with the first and second mezzanine cards 20a, 20b, the third mezzanine card 24 includes respective connector assemblies and electronic components mounted thereon. The third mezzanine card 24 is connected to the host card 12 outside a connection area of the first and second mezzanine cards 20a, 20b.

FIGS. 2a–2d show several alternative embodiments of the third mezzanine card of the present invention. In all embodiments, connectors 22b are provided on the third mezzanine card 24 to connect with the connectors 22. The connectors 22b may correspond to a set of two, three or four connectors, depending on the particular design considerations. Those of skill in the art should recognize that a combination of any of the embodiments of FIGS. 2a–2d is contemplated by the present invention.

Figure 2A:
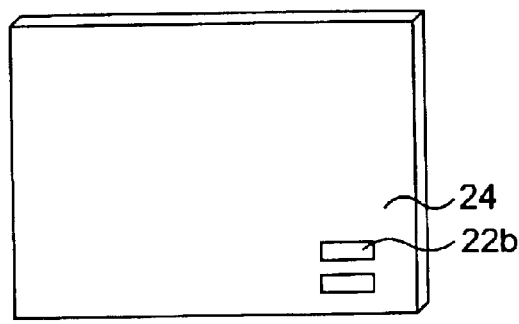
FIGS. 2a–2d show several alternative embodiments of the third mezzanine card of the present invention.

In the embodiment of FIG. 2a, the third mezzanine card 24 does not include cooling ribs. When using this embodiment, at least the cooling ribs 14b of the host card 12 will have a higher profile to ensure that the third mezzanine card 24 is mounted above any of the above-discussed combinations of the first and second mezzanine cards, 20a, 20b and equivalents thereof. This further ensures that there is no mechanical interference or contact between the third mezzanine card 24 and the components of the first or second mezzanine cards, 20a, 20b.

Figure 2B:
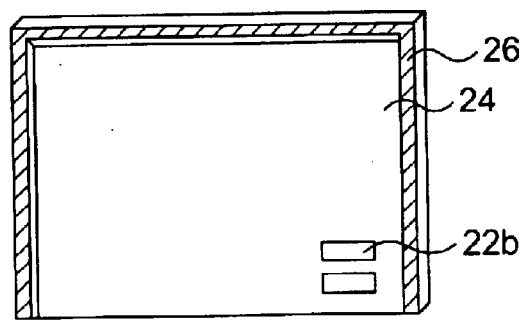

In the embodiment of FIG. 2b, the third mezzanine card 24 includes a cooling rib 26 with a high profile capable of eliminating the need for the cooling ribs and facing plate rib of the host card 12. Again, the profile of the cooling rib 26 ensures that the third mezzanine card 24 is mounted above any of the above-discussed combinations of the first and second mezzanine cards, 20a, 20b and equivalents thereof. Again, this further ensures that there is no mechanical interference or contact between the third mezzanine card 24 and the first or second mezzanine cards, 20a, 20b.

Figure 2C:
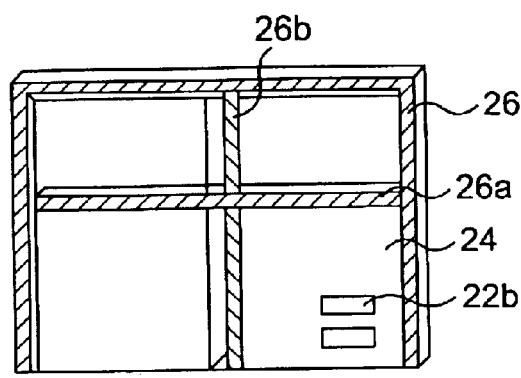

In the embodiment of FIG. 2c, the third mezzanine card 24 may be of a size that extends only partially between the entire portion of the cooling rib 26. The size of the third mezzanine card 24 will depend on various design considerations such as the need for additional functionality of the designed system. It should be well understood by those of skill in the art that the placement of the third mezzanine card 24 maybe in any position corresponding to the connectors 22, which are outside of the mounting area of the first and second mezzanine cards 20a, 20b. Thus, the third mezzanine card 24 may be placed entirely over the component field of the first or second mezzanine cards, 20a, 20b, partially over one or both of the mezzanine cards 20a, 20b or any combination thereof, for example. The embodiment of FIG. 2c also shows the use of additional ribs 26a and 26b, mounted vertically or horizontally thereon. The additional ribs 26a and 26b may be used in any embodiment, and should not mechanically interfere with the first and second mezzanine cards 20a, 20b.

Figure 2D:
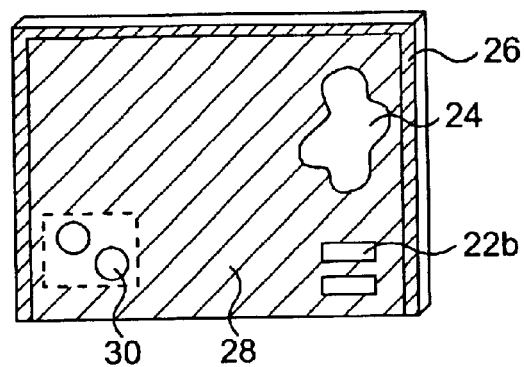

In the embodiment of FIG. 2d, the third mezzanine card 24 includes a plate 28, whether it is a solid plate or a plate with cutouts 30. The plate 28 may be used with any of the embodiments shown.

Figure 3:
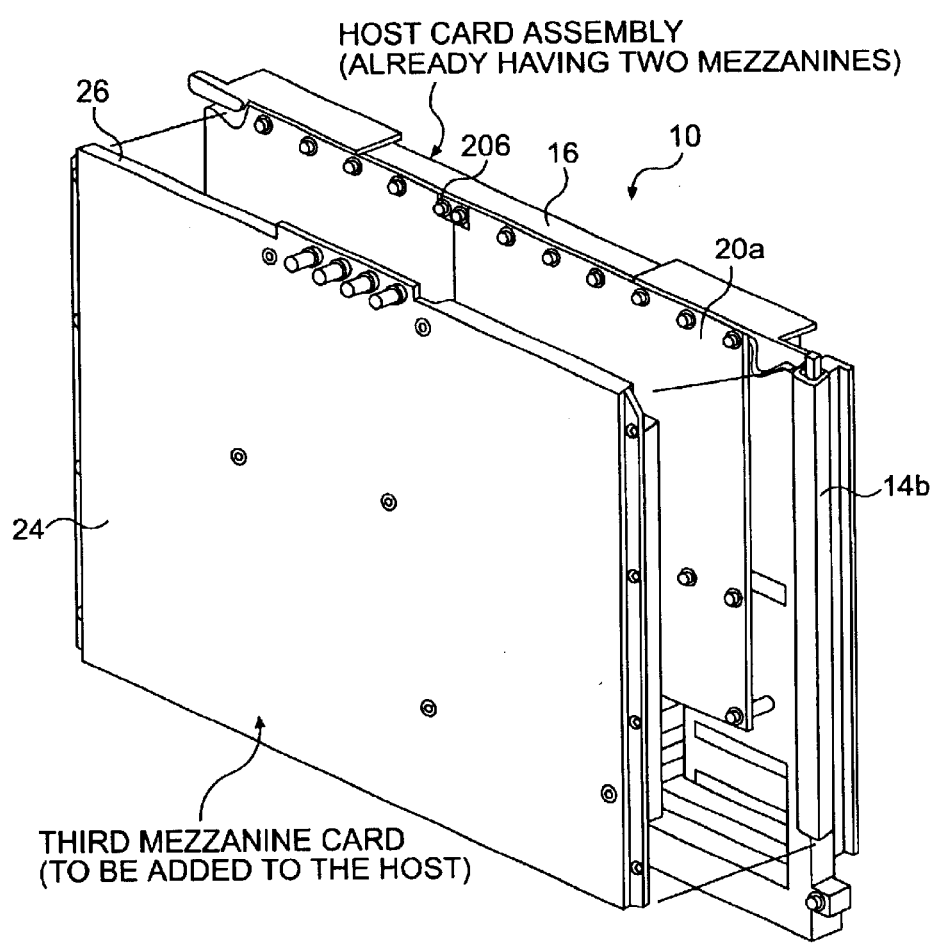
FIG. 3 shows a partially assembled perspective view of the host card and mezzanine cards of the present invention.

FIG. 3 shows a partially assembled perspective view of the host card and mezzanine cards of the present invention. In this view, the first and second mezzanine cards 20a, 20b are mounted to the host card 12, and more particularly to the center rib 14a and the faceplate rib 16 via any conventional mounting mechanism. In the embodiment shown in FIG. 3, the first and second mezzanine cards may be a single, larger mezzanine card. The third mezzanine card 24 is mounted over the component field of the first and second mezzanine cards 20a, 20b. But, as discussed above, the third mezzanine card may be mounted over other configurations, as well. The mounting of the third mezzanine card 24 is accomplished by mounting the cooling rib 26 to the outer edge ribs 14b. This mounting configuration prevents mechanical interference or contact between the components on the mezzanine cards 20a and 20b and the third mezzanine card 24. This configuration also provides a conduction-cooling path for the third mezzanine card 24. The mounting may be accomplished via any known mounting mechanism such as, for example, screws, bolts, adhesives and the like.

While the invention has been described in terms of preferred embodiments, those skilled in the art will recognize that the invention can be practiced with modification within the spirit and scope of the appended claims.

Having thus described our invention, what we claim as new and desire to secure by letters patent is as follows:

1. A circuit card assembly, comprising:
    a host card having connector assemblies and a conduction-cooling path mounted thereon;
    at least one base mezzanine card having electronic circuitry defining a component field, the at least one base mezzanine card being mounted to the conduction-cooling path of the host card and connecting to the connector assemblies; and supplementary mezzanine card having electronic circuitry mounted thereon, the supplementary mezzanine card being mounted to the host card such that a cooling path is provided between the supplementary mezzanine card and the host card and is located over at least a portion of the component field of the at least one mezzanine card, the supplementary mezzanine card being connected to another of the connector assemblies of the host card outside of a connector area and component field of the at least one mezzanine card, wherein the mounting of the supplementary mezzanine card to the host card prevents mechanical interference or contact between the supplementary mezzanine card and the component field.

2. The circuit card assembly of claim 1, wherein the at least one base mezzanine card is a first base mezzanine card and a second base mezzanine card mounted in substantially a same mounting plane with respect to one another and the supplementary mezzanine card is a third mezzanine card mounted outside the connector area of the first and second base mezzanine cards.

3. The circuit card assembly of claim 2, wherein the third mezzanine card is mounted over one of:

(i) a portion of the component field of the first base mezzanine card, (ii) a portion of the component field of the first base mezzanine card and the component field of the second base mezzanine card, and (iii) the component field of the first base mezzanine card and the component field of the second base mezzanine card.

4. The circuit card assembly of claim 1, wherein:

the conduction path is a center cooling rib running along a length of the host card and side edge cooling ribs running along opposing edges of the host card, and the at least one base mezzanine card is mounted to the center cooling rib and the supplementary mezzanine card is mounted to the side edge cooling ribs, the side cooling ribs provides the cooling path between the supplementary mezzanine card and the host card.

5. The circuit card assembly of claim 4, wherein:

the conduction path further includes a faceplate cooling rib, and the at least one base mezzanine card and the supplementary mezzanine card are further mounted to the faceplate cooling rib.

6. The circuit card assembly of claim 4, wherein:

the supplementary mezzanine card includes a cooling rib corresponding to a location of the side edge cooling ribs, a profile of the side edge cooling ribs and the cooling rib prevents mechanical interference between the supplementary mezzanine card and the component field of the at least one mezzanine card, and the side edge cooling ribs further provides the cooling path between the supplementary mezzanine card and the host card.

7. The circuit card assembly of claim 1, wherein:

the supplementary mezzanine card includes opposing cooling ribs corresponding to side edges of the host card, the opposing cooling ribs mounting to the side edges of the host card, a profile of the opposing cooling ribs prevents mechanical interference between the third mezzanine card and the component field of the at least one mezzanine card, and the opposing cooling ribs provides the cooling path between the supplementary mezzanine card and the host card.

8. The circuit card assembly of claim 7, further comprising additional cooling ribs mounted at least horizontally and vertically on the supplementary mezzanine card.

9. The circuit card assembly of claim 7, further comprising a stability plate mounted to the supplementary mezzanine card, the stability plate being one of a solid plate and a plate having cutouts.

10. The circuit card assembly of claim 1, wherein the at least one base mezzanine card is a first base mezzanine card and a second base mezzanine card and the supplementary mezzanine card is a third mezzanine card, the conduction path is a center cooling rib running along a length of the host card and side edge cooling ribs running along opposing edges of the host card, the first and second base mezzanine cards are mounted to the center cooling rib, and the third mezzanine card is mounted to the side edge cooling ribs, the side cooling ribs providing the cooling path between the third mezzanine card and the host card.

11. The circuit card assembly of claim 10, wherein:

the third mezzanine card includes a cooling rib corresponding to a location and being mounted to the side edge cooling ribs of the host card, a profile of the side edge cooling ribs and the cooling rib prevents mechanical interference between the third mezzanine card and the component field of the first and second base mezzanine card, and the side edge cooling ribs and the cooling rib further contributes to the cooling path between the third mezzanine card and the host card.

12. The circuit card assembly of claim 1, wherein:

the conduction-cooling path of the host card includes a center cooling rib and a faceplate cooling rib, the at least one base mezzanine card is a first base mezzanine card and a second base mezzanine card both mounted to the center cooling rib and the faceplate cooling rib, the supplementary mezzanine card is a third mezzanine card having cooling ribs located at least at two side edges thereof, the cooling ribs are mounted to opposing side edges of the host card on sides of the center cooling rib and the faceplate cooling rib, a profile of the cooling ribs of the third mezzanine card prevents mechanical interference between the third mezzanine card and the component field of the first and second base mezzanine cards, and the cooling ribs provides the cooling path between the third mezzanine card and the host card.

13. A circuit card assembly, comprising:

a host card having connector assemblies and a conduction-cooling path mounted thereon;

a first base mezzanine card having electronic circuitry defining a component field, the first base mezzanine card being mounted to the conduction-cooling path and connecting to a first set of the connector assemblies;

a second base mezzanine card having electronic circuitry defining a component field, the second base mezzanine card being mounted to the conduction-cooling path and connected to a second set of the connector assemblies; and a third mezzanine card having electronic circuitry, the third mezzanine card being mounted to the host card and over at least a portion of the component field of at least one of the first and second base mezzanine cards such that mechanical interference between the third mezzanine card and the component field of the first and second base mezzanine cards is prevented, the third mezzanine card being further connected to a third set of the connector assemblies of the host card outside of a connecting area of the first and second base mezzanine cards, wherein at least the conduction-cooling path provides a cooling path between the first and second base mezzanine cards and the host card.

14. The circuit card assembly of claim 13, wherein:

the conduction path is a center cooling rib running along a length of the host card and side edge cooling ribs running along opposing edges of the host card, the first and second base mezzanine cards are mounted to the center cooling rib and the third mezzanine card is mounted to the side edge cooling ribs.

15. The circuit card assembly of claim 14, wherein:

the conduction-cooling path further includes a faceplate cooling rib, the third mezzanine card includes a cooling rib corresponding to a location of the side edge cooling ribs and the faceplate cooling rib, a profile of the side edge cooling ribs and the cooling rib raises a mounting position of the third mezzanine card above mounting positions of the first and second base mezzanine cards thus preventing mechanical interference between the third mezzanine card and the component field of the first and second base mezzanine cards, the side edge cooling ribs and the cooling rib contributes to a cooling path between the third mezzanine card and the host card, and the first and second base mezzanine cards and the third mezzanine card are further mounted to the faceplate cooling rib.

16. The circuit card assembly of claim 15, further comprising at least one of additional cooling rib mounted at least horizontally and vertically on the third mezzanine card and a stability plate mounted to the third mezzanine card.

17. The circuit card assembly of claim 13, wherein:

the conduction-cooling path is a center cooling rib running along a length of the host card and a faceplate cooling rib positioned parallel to the center cooling rib at an edge of the host card, the third mezzanine card includes a conduction-cooling path running at least along opposing edges thereof, the first and second base mezzanine cards are mounted to the center cooling rib and the faceplate cooling rib, the third mezzanine card is mounted to the host card via the side edge cooling ribs, a profile of the conduction-cooling path of the third mezzanine card prevents mechanical interference between the third mezzanine card and the component field of the first and second base mezzanine cards, and the side edge cooling ribs provides a cooling path between the third mezzanine card and the host card.

18. A circuit card assembly, comprising:

a host card having connector assemblies and a conduction-cooling path mounted thereon;

a first base mezzanine card having electronic circuitry defining a component field, the first base mezzanine card being mounted to the conduction-cooling path and connecting to a first set of the connector assemblies;

a second base mezzanine card having electronic circuitry defining a component field, the second base mezzanine card being mounted to the conduction-cooling path and connecting to a second set of the connector assemblies; and a third mezzanine card having electronic circuitry and a conduction-cooling path, the conduction-cooling path of the third mezzanine card being mounted to the conduction-cooling path of the host card such that the third mezzanine card is mounted over at least a portion of one of the first and second base mezzanine cards, wherein the conduction-cooling path of the host card and the third mezzanine card provides a cooling path, the conduction-cooling path of the host card and the third mezzanine card-provides a mounting platform which raises the mounting position of the third mezzanine card above the first base mezzanine card and the second base mezzanine card, and the third mezzanine card is connected to a third set of the connector assemblies outside a connecting area of the first and second base mezzanine cards.

19. The circuit card assembly of claim 18, wherein the conduction cooling path of the host card is a center cooling rib and a faceplate cooling rib running along a length thereof and side edge cooling ribs running along opposing edges thereof, the first and second base mezzanine cards are mounted to the center cooling rib and the faceplate cooling rib, the conduction-cooling path of the third mezzanine card includes cooling ribs corresponding to a placement of the side edge cooling ribs and the faceplate cooling rib of the host card such that the cooling ribs are mounted to the side edge cooling ribs and the faceplate cooling rib, and a profile of the side edge cooling ribs and the cooling ribs prevents contact between the third mezzanine card and the component field of at least the first base mezzanine card and the component field of the second base mezzanine card.

20. The circuit card assembly of claim 18, wherein the third mezzanine card is mounted over one of:

(i) a portion of the component field of the first base mezzanine card, (ii) a portion of the component field of the first base mezzanine card and the component field of the second base mezzanine card, and (iii) the component field of the first base mezzanine card and the component field of the second base mezzanine card.

* * * * *